United States Patent [19]
Tateyama et al.

[11] Patent Number: 5,871,584
[45] Date of Patent: Feb. 16, 1999

[54] PROCESSING APPARATUS AND PROCESSING METHOD

[75] Inventors: Kiyohisa Tateyama, Kumamoto; Masafumi Nomura; Takayuki Tomoeda, both of Kumamoto-ken, all of Japan

[73] Assignees: Tokyo Electron Limited, Tokyo; Tokyo Electron Kyushu Limited, Tosu, both of Japan

[21] Appl. No.: 929,106

[22] Filed: Sep. 15, 1997

Related U.S. Application Data

[63] Continuation of Ser. No. 510,297, Aug. 2, 1995, abandoned.

[30] Foreign Application Priority Data

Aug. 3, 1994 [JP] Japan .................................. 6-200289

[51] Int. Cl.[6] .............................. B05B 3/00; B08B 3/00
[52] U.S. Cl. ............................ 118/323; 118/319; 118/52; 134/153; 134/902
[58] Field of Search ..................... 118/600, 602, 118/52, 319, 320, 63, 323; 134/902, 153, 198, 149; 15/302; 18/325

[56] References Cited

U.S. PATENT DOCUMENTS

| | | | |
|---|---|---|---|
| 3,141,793 | 7/1964 | Oliphant | 118/325 |
| 3,656,173 | 4/1972 | Fussel | 118/50 |
| 3,950,184 | 4/1976 | Adams et al. | 15/302 |
| 4,451,507 | 5/1984 | Beltz et al. | 118/52 |
| 5,084,483 | 1/1992 | Yamashita et al. | 427/345 |

FOREIGN PATENT DOCUMENTS

| | | | |
|---|---|---|---|
| 2-030118 | 1/1990 | Japan | 118/52 |
| 3 262563 | 11/1991 | Japan . | |
| 7136572 | 5/1995 | Japan | 118/600 |

*Primary Examiner*—David A. Simmons
*Assistant Examiner*—Calvin Padgett
*Attorney, Agent, or Firm*—Oblon, Spivak, McClelland, Maier & Neustadt, P.C.

[57] ABSTRACT

A develop processing apparatus is provided for processing an object with a developing solution, comprising a retaining member for rotatably retaining the object, a developing solution supply nozzle for supplying the developing solution to the object, a developing solution sucking nozzle for sucking the developing solution supplied to the object, a developing solution supply nozzle moving mechanism for moving the developing solution supply nozzle above the object, a developing solution sucking nozzle moving mechanism for moving the developing solution sucking nozzle above the object. After the developing solution is supplied to the object subsequent to moving the developing solution supply nozzle, the developing solution sucking nozzle is moved and the developing solution on the object is sucked.

15 Claims, 7 Drawing Sheets

PROCESSING APPARATUS AND PROCESSING METHOD

This application is a continuation of application Ser. No. 08/510,297, filed on Aug. 2, 1995, now abandoned.

BACKGROUND OF THE INVENTION

1. Field of the Invention

The present invention relates to a processing apparatus and processing method which supply a processing liquid to an object, such as an LCD substrate, and process the object with the processing liquid.

2. Description of the Related Art

In the manufacturing process of a liquid crystal display (LCD), in general, in order to form, for example, an indium-tin-oxide (ITO) thin film or an electrode pattern on an LCD substrate (glass substrate), a lithography method similar to that for the manufacture of a semiconductor device has been employed whereby a series of processing steps including transferring a circuit pattern, etc., in reduced form on a photoresist and subjecting it to developing process, is carried out.

For example, a rectangular LCD substrate (an object to be processed), after being washed by a washing device, is subjected by an adhesion processing device to hydrophobic treatment and it is cooled by a cooling device. Thereafter, a photoresist film is coated on the resultant LCD substrate by means of a resist coating device. At a heat treating device, a baking step is effected to heat the photoresist film and, after the substrate is exposed with light of a predetermined pattern with the use of an exposing device, the exposed LCD substrate is developed with a developing solution by a developing device, followed by the washing of the developed substrate with a rinse. By doing so, a developing process is completed.

In the process as set out above, a developing solution is applied to the surface of an object such as an LCD substrate by means of a spin coating, a spraying or other methods. As one of such processing methods, a paddle type developing system is known according to which a developing solution is jetted by a developing solution supply nozzle having a linear array of nozzle holes, so as to cover the whole surface of the LCD substrate to allow the developing solution to be deposited under a surface tension on a photoresist film on the surface of the LCD substrate so that, upon standing for a predetermined time period, developing is performed on those exposed or unexposed areas of the resist.

In this type of conventional developing system, for example, an LCD substrate of a relatively large area is scanned, with a nozzle, across its whole width and, while this is so done, a developing solution is coated on the LCD substrate, thus tending to use more developing solution than a practically necessary amount. Such a developing solution, after a lapse of a predetermined time, is washed away with a rinse, thus consuming more developing solution and incurring more costs.

In order to solve the problem above it is conceived that the developing solution can be separated from a mixed solution of a used developing solution and rinse. Since, however, not only the developing solution and rinse but also fine dust, etc., on the LCD substrate and associated device enters into a resulting solution, a complex and expensive recycle processing apparatus is required for a developing solution to be recycled from the mixed solution.

SUMMARY OF THE INVENTION

It is, accordingly, the object of the present invention to provide a processing method and processing apparatus which can readily recover a processing liquid used to process an object and can ensure the readiness with which the processing liquid is recycled.

In a first aspect of the present invention there is provided a processing apparatus for processing an object to be processed with a processing liquid, comprising:

retaining means for retaining the object;

processing liquid supply means for supplying the processing liquid to the object; and processing liquid recovering means for recovering the processing liquid supplied by the processing liquid supply means to the object, wherein the recovered processing liquid is reused.

In a second aspect of the present invention there is proved a processing apparatus for processing an object with a processing liquid, comprising:

retaining means for retaining the object;

a nozzle for supplying the processing liquid to the object and for recovering the processing liquid;

a processing liquid supply mechanism for supplying the processing liquid via the nozzle to the object;

a processing liquid recovering mechanism for recovering the processing liquid from the object via the nozzle;

switching means for switching a connection of the nozzle to either one of the processing liquid supply mechanism and the processing liquid recovering mechanism, wherein the recovered processing liquid is reused.

In a third aspect of the present liquid invention there is provided a processing apparatus for processing an object with a processing liquid, comprising:

retaining means for rotatably retaining the object;

processing liquid supply means for supplying the processing liquid to the object;

washing liquid supply means for supplying the washing liquid to the object;

a container surrounding outer peripheries of the retaining means and object and having a discharge outlet for discharging the processing liquid which is scattered into the container;

recovering means for recovering the processing liquid supplied by the processing liquid supply means to a surface of the object;

first recycle processing means for subjecting the processing liquid which is recovered by the recovering means to recycle processing;

second recycle processing means for subjecting a used processing liquid which is discharged via the discharge outlet of the container to recycle processing; and discharging means for discharging the washing liquid.

In a fourth aspect of the present invention there is provided a processing method comprising the steps of:

supplying a processing liquid to a surface of an object to be processed;

recovering step for recovering the processing liquid from the surface of the object; and washing the object by supplying a washing liquid to the object; and wherein the processing liquid recovered by processing liquid recovering step is reused.

In a fifth aspect of the present invention there is provided a develop processing apparatus for processing an object with a developing solution, comprising:

a retaining member for rotatably retaining the object;

a developing solution supply nozzle for supplying the developing solution to the object;

a developing solution sucking nozzle for sucking the developing solution supplied to the object;

a developing solution supply nozzle moving mechanism for moving the developing solution supply nozzle above the object;

a developing solution sucking nozzle moving mechanism for moving the developing solution sucking nozzle above the object, wherein after the developing solution is supplied to the object subsequent to moving the developing solution supply nozzle, the developing solution sucking nozzle is moved and the developing solution on the object is sucked.

DETAILED DESCRIPTION OF THE PREFERRED EMBODIMENTS

The present invention will be explained below in more detail with reference to the accompanying drawings. Here, a processing apparatus of the present invention will be explained as being applied to a coating and developing system for an LCD substrate.

Figure 1:
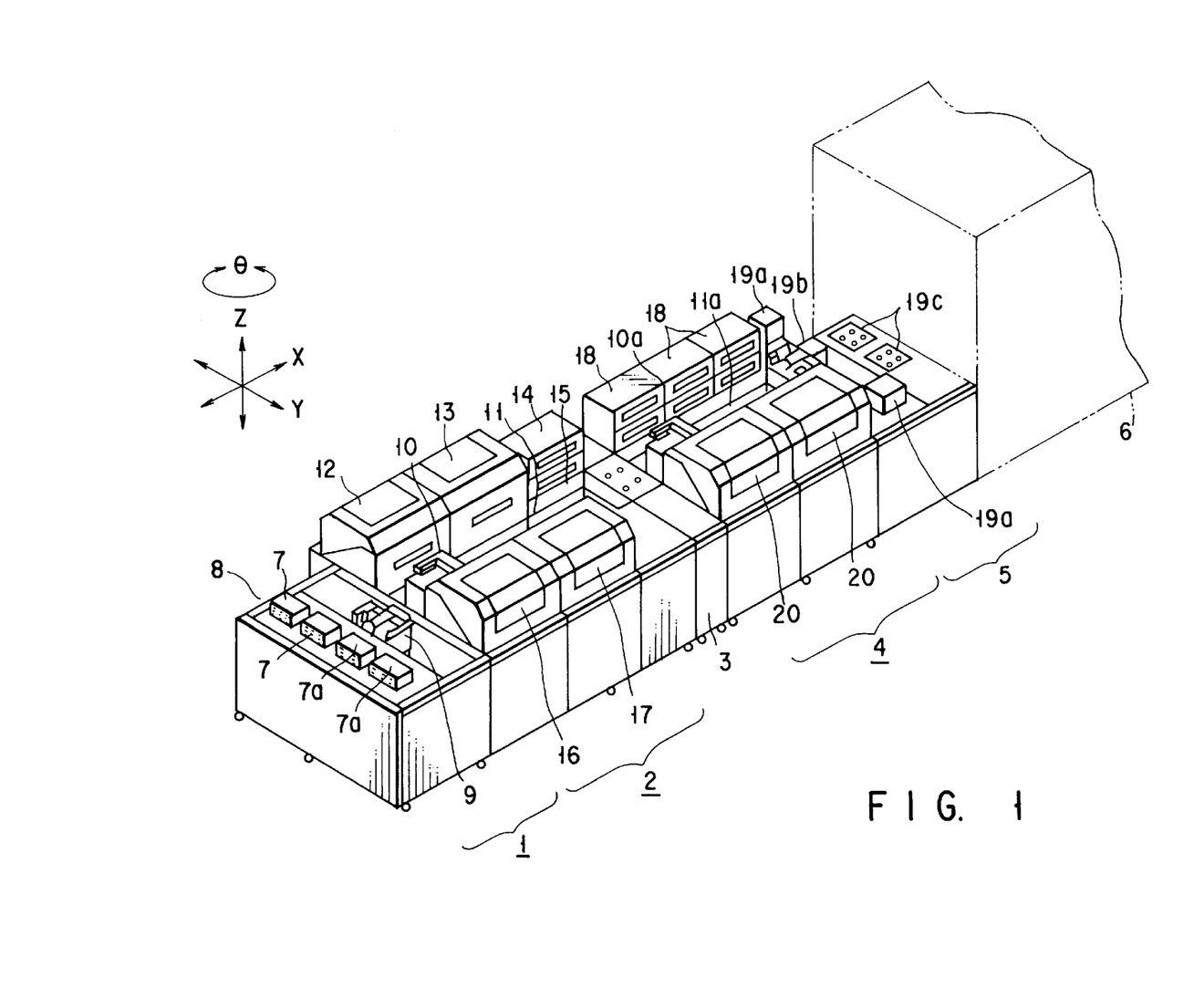
FIG. 1 is a perspective view showing an LCD substrate coating/developing system with a processing apparatus according to the present invention.

The coating and developing system mainly comprises, as shown in FIG. 1, a loader section 1 for loading/unloading LCD substrates G as to-be-processed objects, a first processing section 2 for the substrates G, a second processing section 4, and a transfer section 3 for connecting the first and second processing sections 2 and 4. An exposing device 6 for exposing a resist film with light of a predetermined fine pattern can be connected to a passing section 5 which is provided adjacent to the second processing section 4.

The loader section 1 comprises cassettes 7 for storing to-be-processed substrates G, a cassette rest 8 for placing cassettes 7a for storing "processed" substrates G, and a load/unload arm 9 movable in a horizontal (X, Y) direction and rotatable (θ) in a vertical (Z) direction to allow the substrate G to be passed to the corresponding cassette (7, 7a) on the cassette rest 8.

The first processing unit 2 has a main arm 10 movable in those X, Y, Z directions and rotatable (θ) and a conveying path for the main arm 10 and includes, on one side of the conveying path, a brush-cleaning unit 12 for cleaning the substrate G, a jet-water washing unit 13 for washing the substrate G with high-pressure jet water, an adhesion process unit 14 for subjecting the substrate surface to hydrophobic treatment, and a cooling process unit 15 for cooling the substrate G to a predetermined temperature and, on the other side of the conveying path, a resist coating unit 16 and a coated film removing unit 17.

The second processing unit 4 has, as in the first processing unit, a main arm 10a movable in the X, Y, Z directions and rotatable (θ) and a conveying path 11a for the main arm 10a and includes, on one side of the conveying path 11a, a heat treating unit 18 for heating the substrate G before and after applying a resist liquid so as to subject it to prebaking and postbaking and, on the other side of the conveying path 11a, a developing apparatus 20 constituting the processing apparatus of the present invention.

A transfer section 3c has a box 3c including a transfer base and casters. Support pins are set upright to support the substrate G on the base. As required, the transfer section 3 can be withdrawn from the portion between the first processing unit 2 and the second processing unit 4 to allow an operator to enter the first processing unit 2 or the second processing unit 4 for ready inspection, repairs, etc.

The passing base 5 includes cassettes 19a for temporarily placing the substrates G, a conveying arm 19b for loading or unloading the substrates G into and out of the corresponding cassettes and passing bases 19c for passing the substrate.

In the coating and developing system thus arranged, the unprocessed substrate G stored in the cassette 7 is picked up by the clamp member 9 at the loader section 1, passed to the main arm 10 on the first processing unit 2, and conveyed into the brush-cleaning unit 12. The substrate G is brush-cleaned in the brush-cleaning unit 12 and, if required, washed, in the jet water washing unit 13, with jet water under high pressure. Thereafter, the substrate G is subjected to a hydrophobic treatment in the adhesion process unit 14 and then cooled by a cooling process unit 15. At the resist applying unit 16, a photoresist film, that is, a photosensitive film is formed by a coating step on the substrate and then at the coated film removing unit 17 any unrequired resist film is removed from the edge portion of the substrate G. The photoresist film is heated by the heat treating unit 18 to subject it to baking and then at the exposing unit 6 the substrate G with photoresist film is exposed with light of a predetermined pattern. After being exposed, the substrate G is conveyed into the developing apparatus 20 where it is developed with a developing solution and the developing solution is washed away with a rinse to finish the develop processing.

The resultant "processed" substrate G is loaded into the corresponding cassette 7a on the loader section 1 and, being conveyed, transferred to the next process.

An explanation will be given below of those preferred embodiments of the processing apparatus of the present invention which are use in the coating and developing system for the LCD substrate.

(First Embodiment)

Figure 2:
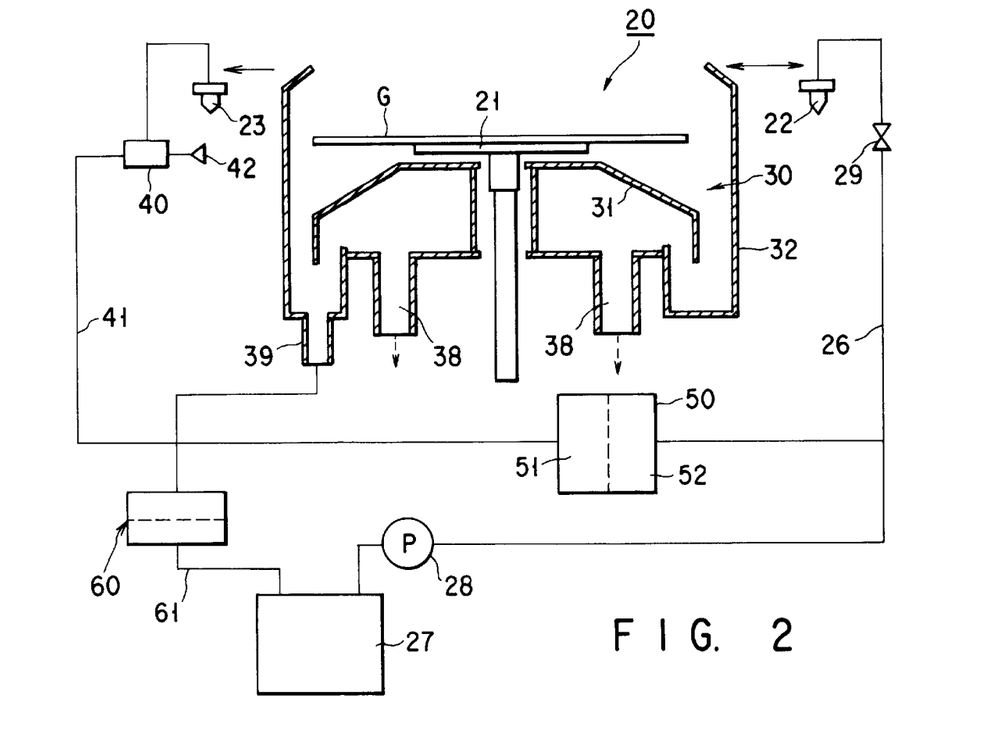
FIG. 2 is a cross-sectional view diagrammatically showing a processing apparatus according to a first embodiment of the present invention.
Figure 3:
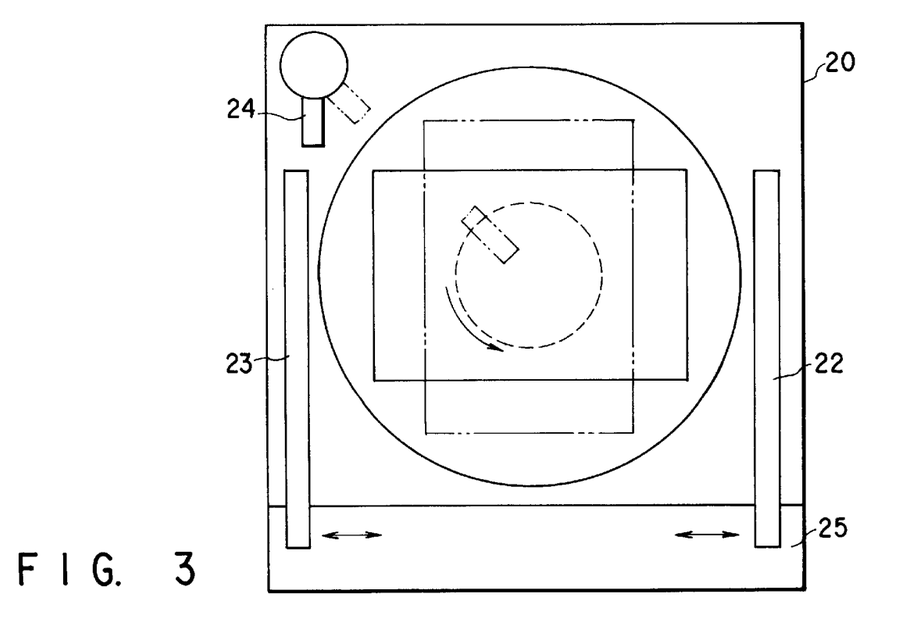
FIG 3 is a plan view showing the processing apparatus of the first embodiment.

The developing apparatus 20 comprises, as shown in FIGS. 2 and 3, a spin chuck 21 for horizontally retaining a substrate G under vacuum suction and adapted to be rotated along a horizontal plane, a container 30 for surrounding the spin chuck 21 and substrate G retained on the spin chuck, a developing solution supply nozzle 22 for supplying a developing solution as a processing liquid to a resist film face on the surface of the substrate G, a suction nozzle 23 serving as a processing liquid recovering means for recovering the processing liquid on the substrate G under a suction force, a washing liquid supplying nozzle 24 for supplying a rinse (washing liquid) to a circuit pattern on the surface of the substance after being developed, and a moving mechanism 25 for moving the developing solution supply nozzle 22 and suction nozzle 23 between a standby position on the right and left sides of the spin chuck 21 and a processing position above the substrate G.

In this case, the developing solution supply nozzle 22 is connected via a developing solution supply pipe 26 to a developing solution holding tank 27 and adapted to supply a developing solution by the driving of a pump 28 on the developing solution supply pipe 26 and by the opening/closing operation of a valve 29.

The suction nozzle 23 is connected to a recycle processing mechanism 50 through a recovering pipe 41 equipped with a suction mechanism 40 and to the developing solution supply tube 26. In this case, the suction mechanism 40 is comprised of an ejector for creating a vacuum through the utilization of air ejected from a compressed air source 42. The suction mechanism 40 is not necessarily constructed of such an ejector and may be replaced by other proper mechanisms such as a vacuum pump, a motor and an aspirator.

The recycle processing means 50 comprises an air/liquid separating mechanism 51 for separating the developing solution which is recovered under suction by the suction nozzle 23 into air and liquid and an impurity removing mechanism 52 for removing an impurity in the developing solution. The developing solution recovered under suction by the suction nozzle 23 has its impurity, etc., removed by the recycle processing means 50 and is regenerated to a developing solution of a predetermined concentration. It is, therefore, possible to recycle the solution back to the developing solution supply tube 26 for reuse. As will be appreciated from above, it may be possible to recycle the regenerated developing solution back to the developing solution holding tank 27.

The container 30 comprises a lower container 31 situated under the spin chuck 21 and substrate G and a outer container 32 situated around the outer edges of the spin chuck 21 and substrate G. An exhaust outlet 38 is provided at the bottom of the lower container 31 and connected to an exhaust device, not shown. A discharge outlet 39 is provided at the bottom of the outer container 32. In this case, a recovering pipe 61 is connected to the discharge outlet 39 and a recycle processing mechanism 60 is provided on an intermediate portion of the recovering pipe 61. To the downstream side of the recycle processing mechanism 60 the developing solution holding tank 27 is connected through the recovering pipe 61. The recycle processing mechanism 60 has the sam structure as that of the recycle processing mechanism 50 and is adapted to separate a rinse and impurity from a mixture of the developing solution and rinse for removal. By the use of such recycle processing mechanism 60, only the developing solution from the mixture of the developing solution and rinse is returned back to the developing solution holding tank 27 for recycling.

The developing solution supply nozzle 22 and suction nozzle 23 can be so formed as to have the same head unit and, therefore, the suction nozzle 23 will be explained below.

Figure 4:
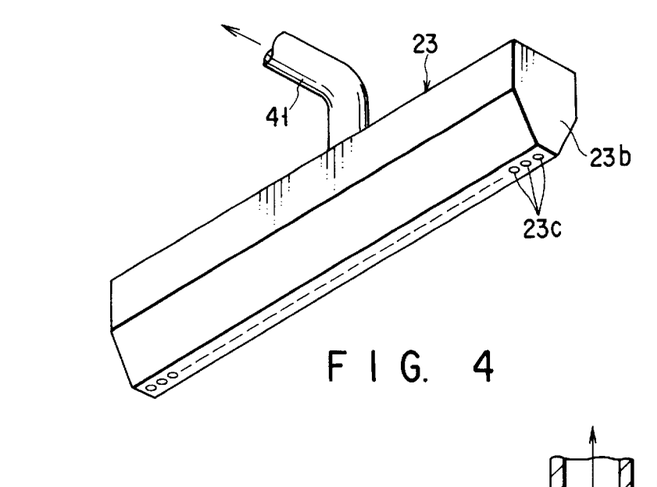
FIG 4 is perspective view showing a processing liquid sucking nozzle for use in the processing apparatus of the present invention.
Figure 5:
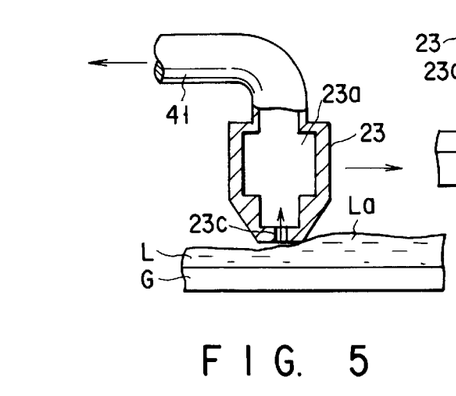
FIG. 5 is a cross-sectional view for explaining a suction operation of a processing liquid sucking nozzle for use in a processing apparatus of the present invention.

The suction nozzle 23 includes, as shown in FIG. 4, a head 23b having a length substantially the same as the width of the substrate G and tapered toward its lower end and a large number of suction holes 23c provided a linear array at proper intervals on the lower end face of the head 23b. In place of the suction holes use may be made of a slit of a narrow gap. As shown in FIG. 5, a developing solution holding chamber 23a is provided inside the head 23b and the recovering pipe 41 is connected to the upper end side of the developing solution holding chamber 23a.

In the suction nozzle 23 thus structured, the suction mechanism 40 is driven to set the developing solution holding chamber 23a in a negative pressure state. By doing so, a developing solution La on the substrate G is sucked from the suction holes 23c and pumped to the recycle processing means 50. In the case of the developing solution supply nozzle 22, developing solution jetting holes are provided, in place of the suction holes 23c, in the lower end face of a head equipped with a developing solution holding chamber and the developing solution supply pipe 26 is connected to the developing solution holding chamber of the nozzle 22.

Figure 6:
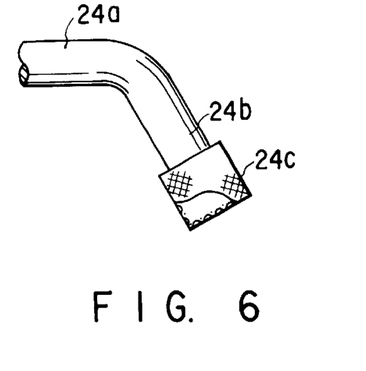
FIG. 6 is a side view, partly in cross-section, showing a washing nozzle for use in the processing apparatus of the present invention.

On the other hand, the washing liquid supply nozzle 24 is provided near the standby side of the suction nozzle 23 of the developing device 20 as shown in FIG. 3. The washing liquid supply nozzle 24 includes, as shown in FIG. 6, an arm 24a so mounted as to be rotatable in a horizontal direction, a head 24b mounted on the forward end of the arm 24a and diagonally bent downwardly, and, for example, a bottom-cylinder-like mesh unit 24c mounted on the forward end of the head 24b. With the mesh unit 24 mounted on the forward open end of the washing liquid supply nozzle 24, a rinse is flown from the washing liquid supply nozzle 24 and stopped. By doing so, the rinse is held due to a capillary action on the mesh unit, thus preventing the falling of rinse drops.

The washing liquid supply nozzle 24 is not necessarily of such a type as to be rotatable in the horizontal direction as shown FIG. 3, and may be of such a type as to be moved in a linear way as in the case of the developing solution supply nozzle 22 and suction nozzle 23.

(Second Embodiment)

Figure 7:
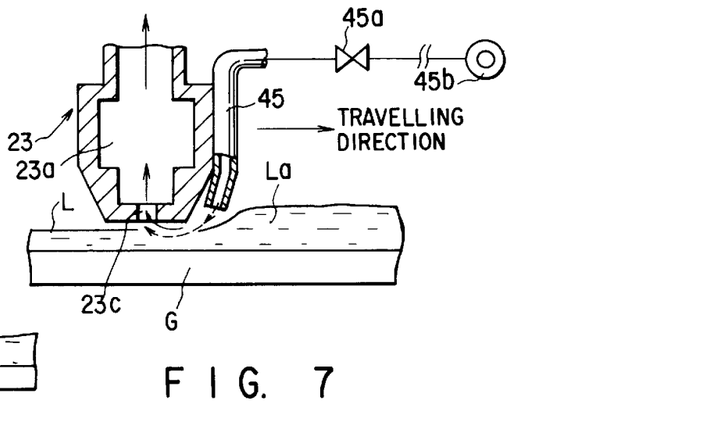
FIG. 7 is a cross-sectional view showing a processing liquid sucking nozzle for use in a processing apparatus according to a second embodiment of the present invention.

FIG. 7 is a view showing a processing liquid recovering means of a processing apparatus according to a second embodiment of the present invention.

In order to more certainly suck a processing liquid for recovering, a gas jetting means, such as an $N_2$ gas jetting nozzle 45, for forcing a developing solution La toward suction holes 23c is provided near the suction holes 23c on a forward side as viewed in a travelling direction of the suction nozzle 23. The $N_2$ gas jetting nozzle 45 is connected to an $N_2$ gas supply source 45b via a valve 45. It is preferable that the $N_2$ gas jetting nozzle 45 be provided either in plural numbers or on slit-like form to allow the solution to be forced toward all the suction holes 23c.

In this arrangement, with an $N_2$ gas jetted from the $N_2$ gas jetting nozzle 45 and the suction nozzle 23 set in a negative pressure state, a substrate G is scanned by the suction nozzle 23 in a direction as indicated by an arrow and, by doing so, the developing solution La is forced by the $N_2$ gas toward the suction hole 23c side of the suction nozzle 23 so that the developing solution La can be sucked certainly and efficiently. In this embodiment, the other structure is substantially the same as the counterpart of the first embodiment and any further explanation is, therefore, omitted for brevity.

(Third Embodiment)

Figure 8:
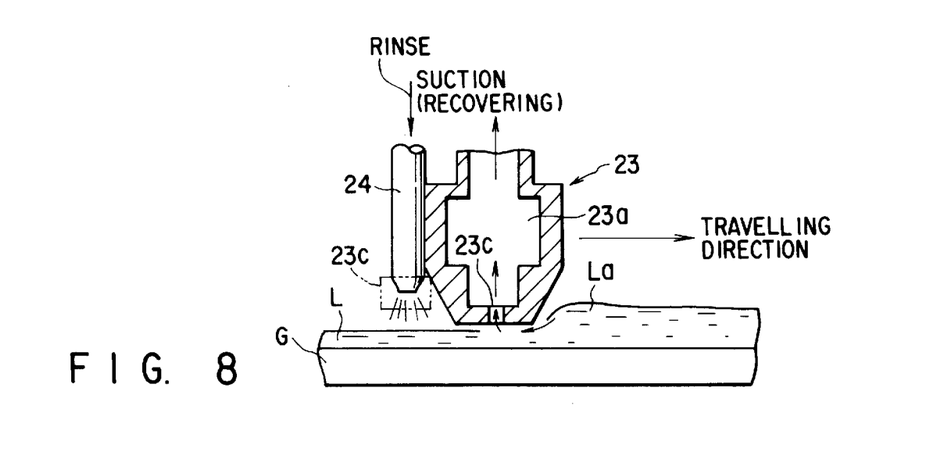
FIG. 8 is a cross-sectional view showing a processing liquid sucking nozzle for use in a processing apparatus according to a third embodiment of the present invention.

FIG. 8 is a cross-sectional view showing a processing liquid recovering means and washing liquid supply means in a third embodiment of the present invention.

With this embodiment, in order to achieve the recovering of a developing solution and supply of a washing liquid simultaneously, for example, a washing liquid supply nozzle 24 with, for example, a slit-like jetting hole or a plurality of jetting holes is provided on a rear side as viewed in a travelling direction of a suction nozzle 23. In this case, a developing solution La is sucked by the suction nozzle 23 for recovering and a rinse (washing liquid) is supplied from the washing liquid supply nozzle 24 to wash away the developing solution. In order to suck the rinse from a suction hole 23c, the direction in which the rinse is supplied may be on a rear side, that is, on a side opposite to a travelling direction of the suction nozzle 23.

With the embodiment above, it is possible to perform two steps substantially simultaneously, that is, a step of recovering the developing solution La and a step of washing the surface of a substrate G through the supplying of the washing liquid. By doing so it is possible to improve the processing efficiency.

The third embodiment is substantially the same in terms of the other structure as the first embodiment and any further explanation is, therefore, omitted.

(Fourth Embodiment)

Figure 9A:
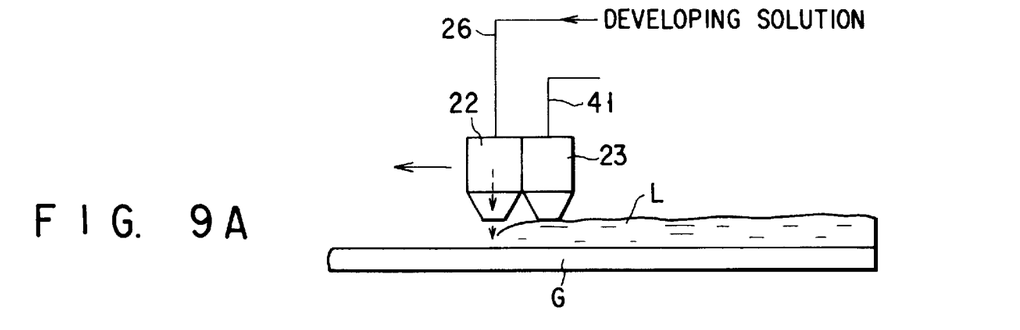
FIGS. 9A and 9B are a cross-sectional view for explaining the operation of a processing liquid supply nozzle and processing liquid sucking nozzle, respectively, in a processing apparatus according to a fourth embodiment of the present invention.
Figure 9B:
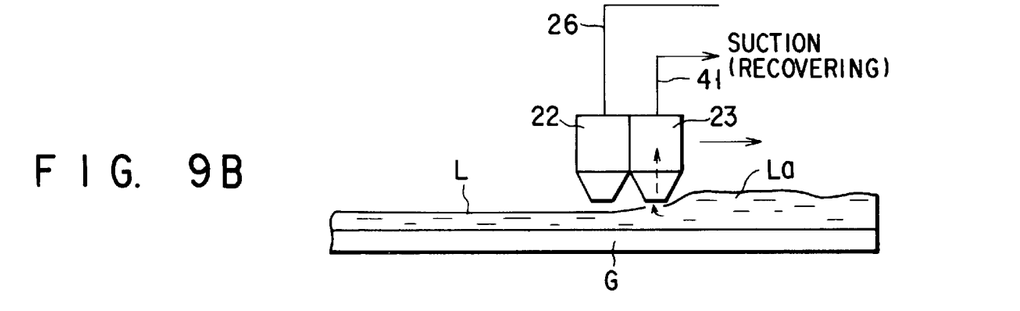

FIGS. 9A and 9B are side views diagrammatically showing a processing liquid supply means and processing liquid recovering means in a processing apparatus according to a fourth embodiment of the present invention.

In this embodiment, in order to achieve a compact apparatus and to shorten the operation for the supplying of a processing liquid as well as for the recovering of the processing liquid, a developing solution supply nozzle 22 and suction nozzle 23 are arranged in proximity to each other and they are reciprocably moved by a common moving mechanism, not shown. In this case, for example the developing solution is supplied in a forward motion time (FIG. 9A: a processing liquid supplying step) and a developing liquid La is sucked in a backward motion time (FIG. 9B: a recovering step) for recovering.

With thus embodiment, the developing solution supply nozzle 22 and suction nozzle 23 are arranged near each other and it is possible to effectively utilize space and hence to obtain a compact apparatus. Since the supplying of the developing solution from the developing solution supply nozzle 22 and sucking of the developing solution La by the suction nozzle 23 are performed in a reciprocating movement, it is possible to effectively shorten a recovering operation of a processing liquid.

With respect to the other arrangement, the fourth embodiment is substantially the same as the first embodiment.

(Fifth Embodiment)

Figure 10A:
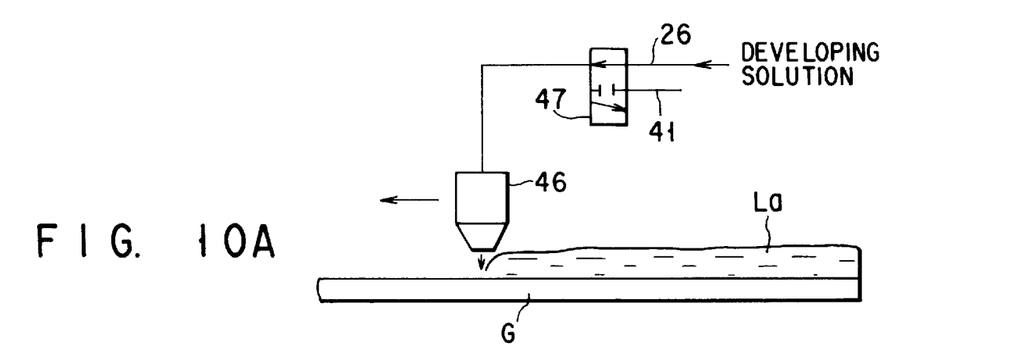
FIGS. 10A and 10B are cross-sectional views for explaining a processing liquid supply operation and processing liquid sucking operation, respectively, by a processing liquid supplying/processing liquid sucking nozzle in a processing apparatus according to a fifth embodiment of the present invention.
Figure 10B:
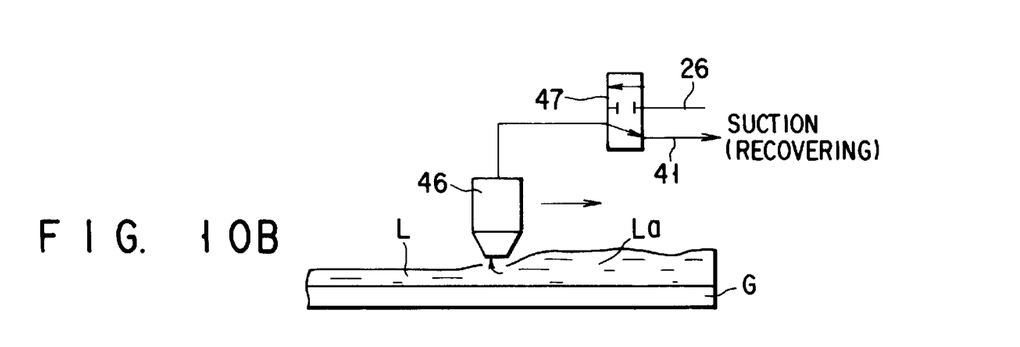

FIG 10A and 10B are side view diagrammatically showing a processing liquid supplying means and processing liquid recovering means in a processing apparatus according to a fifth embodiment of the present invention.

In this embodiment, in order to achieve a compact apparatus and to shorten the operation of supplying processing liquid and recovering the processing liquid, use can be made of, in place of the above-mentioned developing solution supply nozzle 22 and suction nozzle 23, a developing solution supplying/sucking nozzle 46 of the same structure except that, in the nozzle 46, a developing solution supply pipe 26 and suction pipe 41 are connected to a developing solution holding chamber via a switching valve 47 serving as a switching means.

In the arrangement thus obtained, when the developing solution is supplied, the switching valve 47 is set to a position where it is connected to the developing solution supply tube 26 and developing solution holding tank. At the same time, a substrate G is scanned, by the nozzle 46, for example to the left so that a developing solution L is supplied (coated) onto the substrate G - See FIG. 10A. When, on the other hand, the developing solution La is to be recovered, the switching valve 47 is set to a position where it is connected to the recovering pipe 41, suction mechanism and recycle processing means. In this state, the substrate is scanned, by the nozzle 46, for example to the right and, at the same time, the nozzle 46 is set in a negative pressure to suck the liquid solution La for recovering—See FIG. 10B.

According to the present embodiment, the nozzle 46 serves the dual function of the developing solution supply nozzle 22 and suction nozzle 23. It is, therefore, possible to effectively utilize space and reduce component members required and hence to achieve a compact apparatus. Since, as in the same way as in the fourth embodiment, the supplying of the developing solution and sucking of the developing solution can be effected in reciprocatory motion, the recovering operation can be shortened or effectively performed.

With regard to the other structure, the fifth embodiment is substantially the same as the first embodiment and any further explanation is omitted for brevity.

(Sixth Embodiment)

Figure 11:
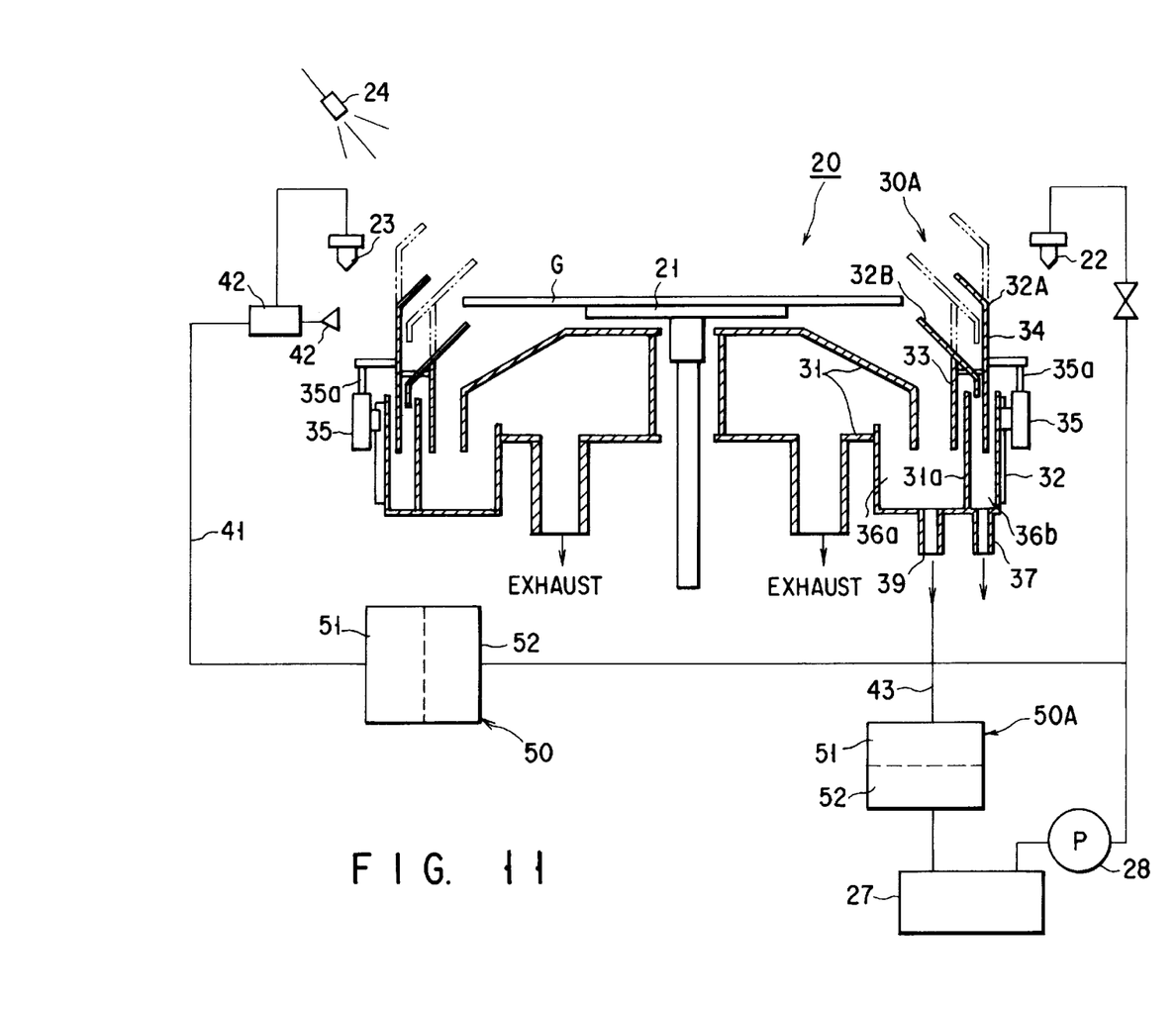
FIG. 11 is a cross-sectional view diagrammatically showing a processing apparatus according to a sixth embodiment of the present invention.

FIG. 11 is a cross-sectional view showing a processing apparatus according to a sixth embodiment of the present invention.

This embodiment can recover and recycle a processing liquid by a recovering means as well as a used processing liquid.

In the embodiment above, a container 30A surrounding a spin chuck 21 and substrate G is of such a double-cup structure as to primarily include a lower container 31 surrounding the spin chuck 21 and substrate G, a outer container 32A of a liftable type situated around the outer periphery of the spin chuck 21 and substrate G, an inner container 32B situated between the lower con-tainer 31 and the outer container 32A, a cylindrical partition wall 33 having its upper end mounted inside and on the inner container 32B and opened at a lower side, and a lifting cylinder 35 (a lifting means) connected by a coupling member 34 to enable the outer container 32A, inner container 32B and partition wall 33 to be raised and lowered at the same time.

Figure 12A:
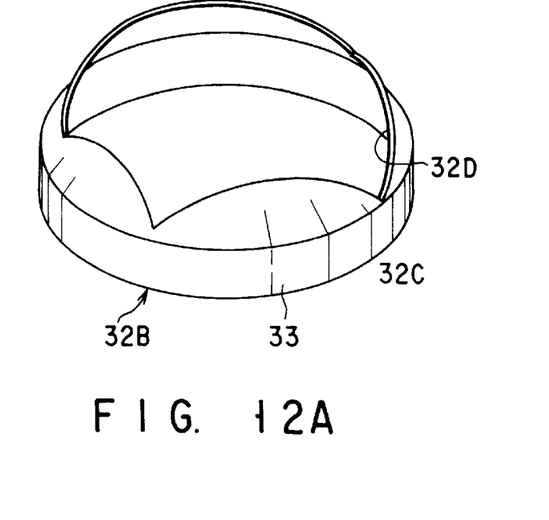
FIG. 12A is a perspective view showing an inner container in a processing apparatus according to a sixth embodiment of the present invention.
Figure 12B:
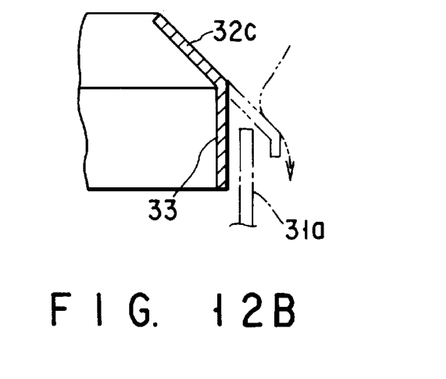
FIG. 12B is a cross-sectional view in enlarged form showing a main portion of the inner container.

In this case, the inner container 32B has, as shown in FIG. 12A, a narrow taper surface 32C on an upper end side of the partition wall 33 and an opening, such as a rectangular cutout 32D provided at the upper end side and substantially similar to, but somewhat greater than, the outer configuration (planar configuration) of the substrate G to allow the substrate G to pass through the opening when the position of the opening is moved up to a position higher than the substrate G. As shown in FIG. 12B, if the peripheral edge portion of the taper surface 32C of the inner container 32B is further extended to cover the top side of a cylindrical wall 31a erected on the outer container 32A side as viewed from the lower container 31, it is possible to prevent an entry, into an inside chamber 36a, of a mixture of washing liquid and developing solution produced at a time washing.

Further, a discharge outlet 39 is provided at a lower side of an inside chamber 36a defined between the lower container 31 and the partition wall 33 of the inner container 32B in the container 30A. A drain outlet 37 is provided at a lower end side of an outside chamber 36b defined between the outer container 32A and the partition wall 33 of the inner container 32A. A second recycle processing mechanism 50A is connected to the discharge outlet 39 through a second recovering tube 43 to subject a used developing solution to recycle processing. The second recycle processing mechanism 50A comprises, as in the recycle processing means 50, an air/liquid separating mechanism 51 for achieving an air/liquid separation and an impurity removing mechanism 52 for removing an impurity in the used developing solution and is connected to a developing solution holding tank 27. A recovering tank, not shown, is connected to the drain outlet 37.

After a developing solution is supplied from the developing solution supply nozzle 22, the substrate is scanned with a suction nozzle 23 and, at the same time, the developing solution is sucked under a negative pressure by a suction mechanism 40. Thereafter, a piston rod 35a of the lifting cylinder 35 is extended, thus lifting the inner container 32B and outer container 32A as indicated by dot-dash lines in FIG. 11. Then the spin chuck 21 is rotated so that a mixture of the used developing solution not recovered by the suction nozzle 23 and an impurity, etc., remaining at a surrounding area is centrifugally forced away from a center to enable it to be recovered from the discharged outlet 39 of the unit inner chamber 36a via the second recovering pipe 43 to the second recycle processing mechanism 50A. The developing solution recycled by the second recycle processing mechanism 50A is returning back to the developing solution holding-tank 27 so that it can again be supplied to the substrate G from the developing solution supply nozzle 22. With the piston rod 35a of the lifting cylinder 35 retracted, the inner container 32B and outer container 32A are lowered as indicated by solid lines in FIG. 11 and then a rinse (washing liquid) is supplied from a washing liquid supply nozzle 24 to the substrate. By doing so, a mixture of the developing solution and rinse is centrifugally forced away from the center area and flowed down the outer chamber 36b and discharged via the drain outlet 37.

Therefore, an upper supernatant portion of the developing solution supplied to the substrate G is sucked by the suction nozzle 23 and recovered back to a first recycle processing mechanism 50. On the other hand, a lower position of the developing solution as set out above is recovered back to the second recycle processing mechanism 50A. The recovered developing solution is regenerated and reused.

In the sixth embodiment, the other arrangement is substantially the same as that of the first embodiment and any further explanation is, therefore, omitted with the same reference employed in the sixth embodiment to designate parts or elements corresponding to those shown in the first embodiment.

The processing method of the present invention will now be explained below with reference to FIGS. 13A to 13D. Here, the processing method will be explained below with the use of the processing apparatus of the first embodiment.

Figure 13A:
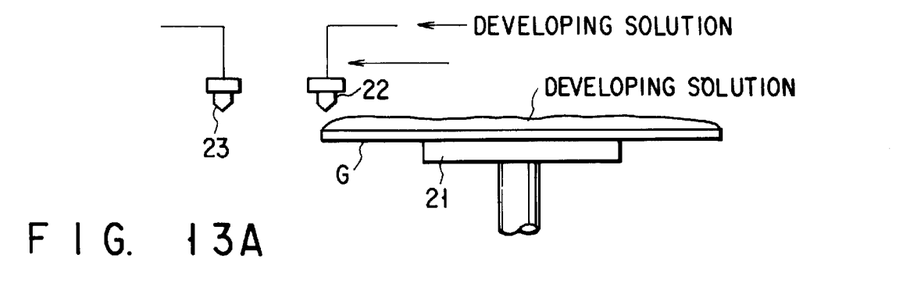
FIGS. 13A to 13D are diagrammatic view showing one example of a processing method according to the present invention.
Figure 13B:
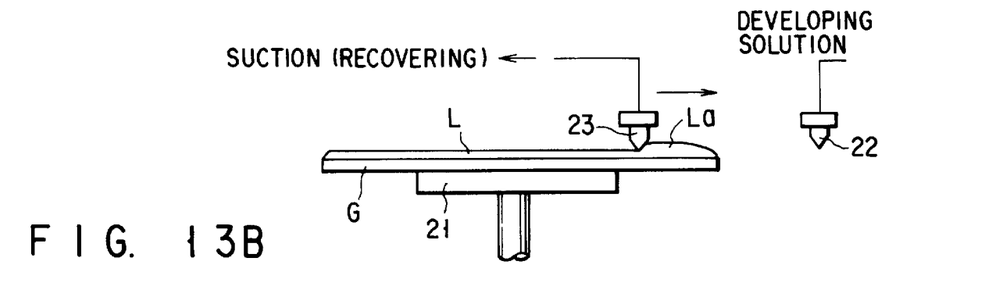

First, a substrate G is loaded by the main arm 10a onto the processing apparatus 20 and, with the substrate G held under a vacuum suction on the spin chuck, the substrate G is scanned by the developing solution supply nozzle 22 along its width or its length direction as shown in FIG. 13A and, in this case, a developing solution L is supplied to the substrate G surface and a solution layer is formed on the substrate G to a thickness (depth) of about 2 mm (a processing liquid supplying step).

Then the developing solution supply nozzle 22 is retracted back to a standby position and develop processing is effected for a predetermined period of time. With the suction nozzle 23 set in a negative pressure state by a suction mechanism, not shown, and the suction nozzle 23 set relative to the substrate G to extent, such as about 0.5mm, to which the forward end of the suction nozzle 23 is not contacted with the substrate G as shown FIG. 13B, the substrate G is scanned with the suction nozzle to suck an excessive supernatant portion from a deposited developing solution La so that it is recovered back to the recycle processing mechanism (processing liquid recovering step). The developing solution La recovered by the recycle processing mechanism is regenerated as set out above and again supplied from the developing solution supply nozzle 22 to the substrate G.

Figure 13C:
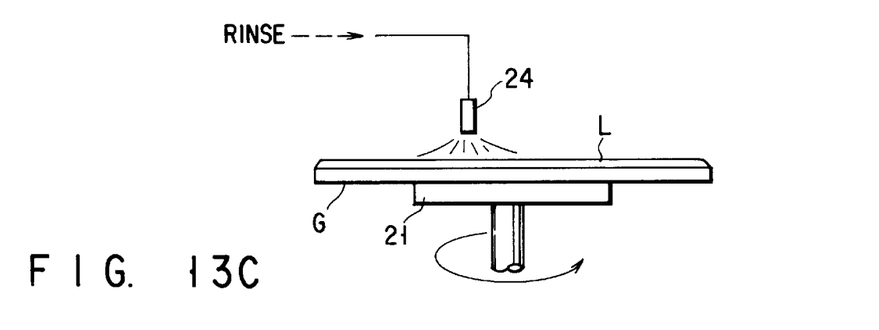

After the developing solution La is substantially sucked by the suction nozzle 23 for recovering, the rinse supply nozzle 24 is moved cover the surface of the substrate G as shown in FIG. 13C to supply the rinse. At the same time, the spin chuck is rotated to cause the deposited developing solution L to be washed away from the substrate G with the use of the rinse (washing step). At that time, as set out in conjunction with the third embodiment, the suction nozzle 23 and washing liquid supply nozzle 24 are arranged near each other whereby it is possible to supply a rinse while recovering the developing solution La.

Figure 13D:
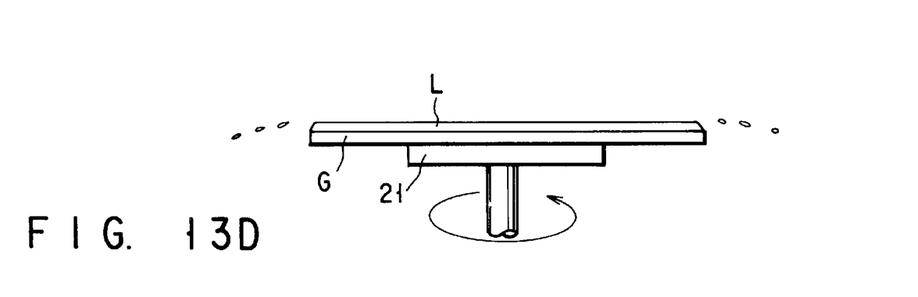

After the stopping of the solution supplying by the washing liquid supply nozzle 24 and the retracting of the washing liquid supply nozzle 24 back to its standby position, the spin chuck 21 is rotated at high speeds as shown in FIG. 13D and the adhered developing solution and rinse are centrifugally blown away from the surface of the substrate G to subject the substrate to a spin-drying (drying step). In this way, processing is completed.

An explanation will now be given about the processing method using the processing apparatus of the sixth embodiment. This method is substantially the same as that in the case of the first embodiment with respect to the process up to the sucking of the developing solution La by the suction nozzle 23 and, therefore, a corresponding explanation is omitted for brevity.

After the developed solution La on the substrate is substantially sucked by the suction nozzle 23 for recovering and the outer container 32A, etc., is lifted, the spin chuck 21 is rotated at high speeds to cause a still adhered developing solution on the surface of the substrate G to be centrifugally scattered off the substrate. The scattered developing solution L hits against the inner walls of the unit inner container 32B and partition wall 33 and flows downwardly in its own weight past the discharge outlet 39 into the second recycle processing mechanism 50A, and is regenerated.

Then the piston rod 35a of the lifting cylinder 35 is retracted, thus lowering the unit outer container 32A, unit inner container 32B and partition wall 33. A rinse is supplied from the washing liquid supply nozzle 24 onto the surface of the substrate G to wash the substrate G. A mixture of the developing solution and rinse is outwardly scattered under a centrifugal action and hits against the inner wall of the unit outer container 32A, flowing downwardly under its own weight to allow it to be discharged via the discharge outlet 37. As a result, the developing solution and mixture of the rinse and developing solution are separated for recovering.

Then the supply of the rinse by the washing liquid supply nozzle 24 is stopped and the substrate G is dried by the rotation of the spin chuck 21 at high speeds, thus completing the develop processing. In this connection it is to be noted that, when the substrate G is rotated at a relatively low speed during the supply of the rinse, no adequate centrifugal action is exerted on the rinse so that the rinse is liable to drip down from the outer edge of the substrate G.

Since, however, the cutout of the inner container 32B is so dimensioned as to be somewhat greater than the substrate G as at the rectangular cutout 32D, the rinse mostly drips from the outer edge of the substrate G onto the taper surface 32C, flows on the outer chamber 36b side, not on the inner chamber 36a side, and discharged via the drain outlet 37 so that the rinse can be prevented from being mixed into the recovered developing solution L.

Although, here, the centrifugal action has been explained as being used as a method for enabling the developing solution to be scattered out of the outer edge of the substrate G, a nozzle (not shown) for jetting a gas such as a nitrogen ($N_2$) toward the surface of the substrate G may be provided whereby the gas is jetted toward the center of the substrate G being placed in a stationary state (in a non-rotated state) to cause a developing solution to be scattered bu the pressure of the jetted gas exerted from the center toward the outer edge of the substrate G. Further, a developing solution may be scattered out of the substrate G under both a gas pressure and centrifugal force, that is, a pressure gas is applied to the substrate being rotated.

Although the scattered liquid has been explained as being discharged under its own weight past the discharge outlet 39 and drain outlet 37, a vacuum device, an exhaust device, etc., not shown, may be provided at the discharge path side to positively discharged and recover a liquid. It is, therefore, possible to discharge a liquid rapidly and certainly.

Figure 14:
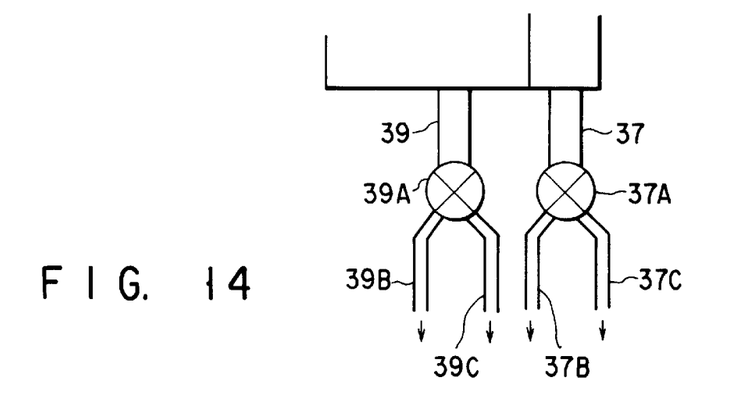
FIG. 14 shows another example of outlet means in the processing apparatus according to the sixth embodiment of the present invention.

Further, changeover valves 39A and 37A may be provided on the discharge outlet 39 and drain outlet 37, respectively, as shown in FIG. 14 so that a liquid can be recovered under fine control.

An explanation will be given below about, for example, lifting the outer container 32A and inner container 32B and recovering a developing solution L while rotating a substrate G.

First, with the switching valve 39A of the discharge outlet 39 set on a pipe 39B side, a developing solution L only is recovered through the pipe 39B. Then with the switching valve 39A set on a pipe 39C side, a rinse is supplied from the washing liquid supply nozzle 24 and a developing solution mixed with a little rinse is recovered through a pipe 39C.

Then the outer container 32A and inner container 32B are lowered and, with the switching valve 37A of the drain outlet 37 set on a pipe 37B side, a rinse is supplied and a rinse containing a little of the developing solution is recovered through the pipe 37B. With the switching valve 37A set on a pipe 37C side, a rinse portion only is recovered through the pipe 37C.

As set out above, by the above-mentioned four types of classification it is possible to ensure ready recycling an re-utilization of the respective liquids and to effectively utilize the liquids involved.

When the respective liquids deposited on the inner wall of the outer container 32A, as well on the inner and outer walls of the inner container 2B, are to be removed and dried up, drying may be effected by an air stream generated around a rotating substrate G and be further promoted by forcing a still remaining liquid toward the discharge outlet 39 and drain outlet 37 through the utilization of such an air stream.

The outer container 32A, inner container 32B, etc., become soiled in frequent uses and needs washing. To this end, for example, a rinse from the washing liquid supply nozzle 24 is supplied to the rotating substrate G with the outer container 32A and inner container 32B set in a lowered position. By doing so, the rinse is centrifugally scattered away from the substrate, so that the inner wall portion of the outer container 32A as well as the outer wall portion (outside portion) of the inner container 32B is washed with the scattered rinse. Further, with the outer container 32A and inner container 32B set in a raised position, the inner wall portion of the inner container 32B, inner wall portion of the partition wall, etc., are washed with the scattered rinse. At this time, in place of the substrate G, a dummy substrate may be placed on the spin chuck 21. This washing is effected from time to time according to practical situations of processing, for example, at a start of a production lot, after the processing of substrates in predetermined numbers, and extent of soiling.

Further, the outer container 32A, inner container, etc., may be constructed as detachable members or as an integral unit so that each can be detached for washing.

Further, although the drain outlet 37 and discharge outlet 39 have been explained as liquid discharge outlets for the outer container 32A and inner container 32B, they may be of such a type that both are connected to a common switching valve whereby it is switched to a discharge side and a drain side in a position downstream of an associated pipe.

Figure 15A:
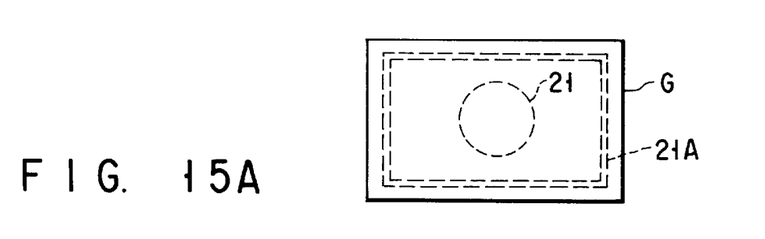
FIG. 15A is a plan view diagrammatically showing an arrangement of a specific member for preventing a processing liquid from flowing onto a reverse surface of a substrate around an outer edge.
Figure 15B:
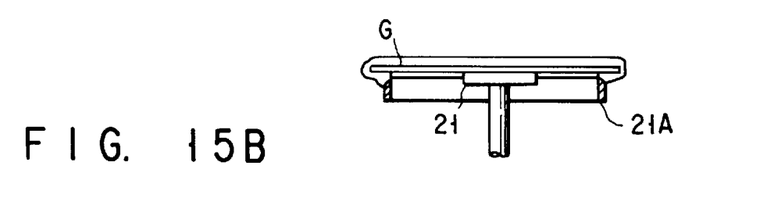
FIG. 15B is a side view diagrammatically showing the arrangement of the specific member.

The recovering and discharge of the solution and rinse at the inner container 32B and outer container 32A may be effected by, instead of raising and lowering these containers, varying the number of rotations of the substrate G so that the liquids are separately recovered through the utilization of a centrifugal action. For example, the dimension of the rectangular cutout 32D of the inner container 32B is so formed as to be greater than on the above-mentioned embodiment and a substrate G is rotated with the inner container set in a lowered state. In this case, at the rotation of the substrate at low speeds the liquid is scattered, under a small centrifugal force, over a smaller distance to enable a developing solution L to be recovered at the unit inner container 32B. At the rotation of the substrate G at high speeds, on the other hand, the liquid is scattered, under a great centrifugal force, over a greater distance so that the rinse is recovered at the outer container 32A In the above-mentioned embodiment, there is a risk that, when the developing solution, etc., supplied on the substrate G flows around the outer edge of the substrate G onto the rear side of the substrate G, it will adversely affect a rotation motor (not shown), etc., because it flows for example along a drive shaft of the spin chuck 21. In order to prevent such flowing-around of the liquid, a specific ring-like member may be provided as shown in FIGS. 15A and 15B to prevent a flowing-around problem. The specific member 21A is, for example, knife edge-formed at its upper end such that there is left a distance of about 0.5 to 2 mm, near the outer edge of the substrate G, between the upper end of the knife-edge and the rear surface of the substrate G. The specific member 21A is mounted by a fitted member (not shown) on the spin chuck 21 so that it can be simultaneously rotated with the spin chuck 21.

Since, as set out above, since with either of the embodiments the developing solution (processing liquid) is quickly recovered upon the completion of processing, it is possible to recover the developing solution in less impurity level. If, therefore, a recovering percentage is somewhat reduced, developing solution which can sufficiently be used can be recovered without any recycle processing mechanism.

Since simply a small percentage of a developing solution is conductive to practical development in terms of its coating level, a greater amount of developing solution which can sufficiently be used can be recovered without the recycle processing mechanism even if the percentage of recovering is about 90%.

Although the present processing apparatus and processing method have been explained as being applied to the coating and developing system for LCD substrates, they can of course be applied to not only an individual developing apparatus but also other processing apparatuses using a processing liquid, such as an etching apparatus and washing apparatus. Further, an object to be processed is not restricted to the LCD substrate and can also be applied to, for example, a silicon wafer.

What is claimed is:

1. A processing apparatus for processing a substrate to be processed with a processing liquid, comprising:

a holder for holding the substrate;

first, second and third nozzles;

wherein said first nozzle is a processing liquid supply nozzle for supplying the processing liquid to the substrate on the holder;

said second nozzle is a suction nozzle which has a suction port for sucking and removing a part of the processing liquid supplied on the substrate by the processing liquid supply nozzle;

a recovering section for recovering the processing liquid removed by the suction nozzle; and wherein said third nozzle is a gas jetting nozzle for jetting gas onto the processing liquid supplied on the substrate and thereby urging a portion of the processing liquid toward the suction nozzle.

2. The processing apparatus according to claim 1, wherein the suction mechanism is moved along an upper surface of the substrate.

3. The processing apparatus according to claim 1, wherein the first nozzle and the second nozzle are provided in proximity to each other and moved as one unit.

4. A processing apparatus for processing a substrate to be processed with a processing liquid, comprising:

a holder for holding the substrate;

a nozzle for supplying the processing liquid to the substrate and for sucking and removing a part of the processing liquid from the substrate;

a processing liquid supply mechanism for supplying the processing liquid to the substrate via said nozzle;

a processing liquid recovering mechanism for recovering the processing liquid sucked from the substrate via said nozzle;

switching means for selectively switching a connection of said nozzle between a first connection and a second connection, and wherein said first connection connects said nozzle to the processing liquid supply mechanism and the second connection connects said nozzle to the processing liquid recovering mechanism, wherein when said switching means connects said nozzle to the first connection the processing liquid is supplied to the substrate via said nozzle and when said switching means connects said nozzle to the second connection the processing is liquid sucked via said nozzle and is reused for further application to a substrate.

5. The processing apparatus according to claim 4, further comprising regenerating means for regenerating the processing liquid which is sucked by the nozzle so as to recycle the processing liquid.

6. A processing apparatus for processing a substrate to be processed with a processing liquid, comprising:

a holder for rotatably holding the substrate;

processing liquid supply means for supplying the processing liquid to the substrate held by said holder;

washing liquid supply means for supplying the washing liquid to the substrate held by said holder;

a container surrounding outer peripheries of the holder and the substrate and having a discharge outlet for discharging the processing liquid which is scattered into the container;

a suction mechanism positioned for sucking and removing a part of the processing liquid, supplied by the processing liquid supply means, from an upper surface of the substrate held by said holder;

a first regenerating mechanism connected to the suction mechanism for regenerating the processing liquid which is sucked by the suction mechanism to recycle the processing liquid;

discharging means connected to said container for discharging the washing liquid from the container; and a second regenerating mechanism connected to the discharge outlet of the container for regenerating a used processing liquid which is discharged via the discharge outlet of the container to recycle the used processing liquid;

wherein the container includes a lower cup arranged below the holder and the substrate, an outer cup arranged outside the outer peripheries of the holder and the substrate and movable in an up/down direction and an inner cup arranged between the lower cup and the outer cup and movable in an up/down direction, wherein the discharge outlet is provided in a bottom of a chamber defined by the lower cup and the inner cup, the apparatus further comprising lifting means for lifting the outer cup and the inner cup and a drain outlet provided in a lower side of the chamber defined by the outer cup and the inner cup, wherein the outer cup and the inner cup are set in a raised position, processing liquid which has left from the substrate is discharged via the discharge outlet and fed to the second regenerating mechanism and, when the outer cup and the inner cup are set in a lowered position, processing liquid which has left from the substrate is discharged via the drain outlet.

7. A processing apparatus for developing a resist coated on an LCD substrate, comprising:

a holder for holding the LCD substrate;

a first nozzle connected to a source of a developing solution, said first nozzle having a plurality of discharge openings which are located above the LCD substrate held by the holder such that the discharge openings are arranged from at least one end of the LCD substrate held by the holder to another end of the LCD substrate, the discharge openings being provided to simultaneously discharge the developing solution onto the LCD substrate held by the holder from said one end of the substrate to said another end of the substrate;

a second nozzle positioned close to and coupled to the first nozzle so as to from a unit with said first nozzle, said second nozzle having a linear suction section which is positioned and arranged above the substrate held by the holder such that said linear suction section extends at least from said one end of the substrate to said another end of the substrate to suck up at least a portion of the discharged developing solution from an upper surface of the LCD substrate held by the holder; and moving means coupled to the first and second nozzles for moving said first and second nozzles along the LCD substrate.

8. A processing apparatus according to claim 7, wherein a first direction extends from said one end of said substrate to said another end of said substrate, and wherein said means for moving moves said first and second nozzles in a second direction, and further wherein said second direction is perpendicular to said first direction.

9. The processing apparatus according to claim 7, further comprising regenerating means for regenerating the processing liquid which is sucked up by the second nozzle to recycle the processing solution sucked up by the second nozzle.

10. A processing apparatus for processing a substrate with a processing liquid, comprising:

a spin chuck for rotatably holding the substrate;

controlling means for variably controlling g a rotating speed of the spin chuck;

a first nozzle positioned and arranged for applying the processing liquid onto the substrate held by the spin chuck;

a second nozzle positioned and arranged for applying a washing liquid onto the substrate held by the spin chuck;

a double cup including at least first and second receptacles arranged concentrically to each other to surround at least outer peripheries and bottoms of the spin chuck and the substrate;

first reproducing means positioned and arranged for receiving, by the first receptacle of the double cup, processing liquid which is centrifuged from the substrate held by the spin chuck, the rotating speed of which is controlled by the controlling means, and also processing liquid which runs off the substrate, and for collecting and reproducing the received processing liquid;

second reproducing means positioned and arranged for receiving, by the second receptacle of the double cup, washing liquid which is centrifuged from the substrate held by the spin chuck, the rotating speed of which is controlled by the controlling means, and also washing liquid which runs off the substrate, and for collecting and reproducing the received washing liquid;

at least one movable partition wall which is movable with respect to said first and second receptacles and with respect to said spin chuck, wherein said at least one movable partition wall is positioned to provide a partition between said first and second receptacles; and means for raising and lowering said movable partition wall between a raised position and a lowered position, such that when said movable partition wall is disposed in said raised position said movable partition wall directs processing liquid into said first receptacle, and when said movable partition wall is disposed in said lowered position said movable partition wall allows said washing liquid to pass over said movable partition wall and into said second receptacle.

11. The processing apparatus according to claim 10, wherein the double cup further comprises:

an inner container and a lower container defining the second receptacle, the inner container surrounding the outer peripheries of the spin chuck and the substrate, and the lower container surrounding the bottom of the spin chuck;

an outer container arranged outside the inner container and defining the first receptacle between the outer container and the inner container;

a first drain, in fluid communication with the first receptacle defined by the inner container and the outer container, for draining the received processing liquid; and a second drain, in fluid communication with the second receptacle defined by the inner container and the lower container, for draining the received washing liquid;

wherein the processing liquid, after being received by the first receptacle defined by the inner container and the outer container is moved to the first reproducing means, and the washing liquid, after being received by the second receptacle defined by the inner container and the lower container is moved to the second reproducing means.

12. The processing apparatus according to claim 10, wherein the second receptacle of the double cup is arranged farther from the substrate than is the first receptacle, and the rotating speed of the spin chuck is higher when the washing liquid is being received by the second receptacle than when the processing liquid is being received by the first receptacle.

13. The processing apparatus according to claim 10, further comprising a reuse means in fluid communication with said first and second reproducing means for reusing the collected processing liquid and washing liquid and supplying the treated processing liquid to the first nozzle and the treated washing liquid to the second nozzle.

14. A develop processing apparatus for processing a substrate with a developing solution, comprising:

a holder for rotatably holding the substrate;

a first nozzle having a plurality of nozzle holes for simultaneously discharging the developing solution onto the substrate held by the holder at least from one end of the substrate to another end of the substrate;

a second nozzle having a linear suction section which is positioned and arranged above the substrate held by the holder to suck up a portion of the discharged developing solution from said one end of the substrate held by the holder to said another end of the substrate;

first moving means coupled to the first nozzle for moving the first nozzle along the substrate held by the holder; and second moving means coupled to the second nozzle, for moving the second nozzle along the substrate held by the holder at least while the second nozzle is sucking up said portion of the developing solution.

15. A processing apparatus according to claim 14, wherein a first direction extends from said one end of said substrate to said another end of said substrate, and wherein said first and second means for moving move said first and second nozzle in a second direction, and further wherein said second direction is perpendicular to said first direction.

* * * * *